(12) United States Patent
Min et al.

(10) Patent No.: US 11,764,160 B2
(45) Date of Patent: Sep. 19, 2023

(54) SEMICONDUCTOR PACKAGES INCLUDING AT LEAST ONE DIE POSITION CHECKER

(71) Applicant: SK hynix Inc., Icheon-si (KR)

(72) Inventors: Bok Gyu Min, Icheon-si (KR); Suk Won Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 165 days.

(21) Appl. No.: 17/148,436

(22) Filed: Jan. 13, 2021

(65) Prior Publication Data
US 2022/0037265 A1    Feb. 3, 2022

(30) Foreign Application Priority Data

Jul. 29, 2020   (KR) .......................... 10-2020-0094286

(51) Int. Cl.
*H01L 23/544*   (2006.01)
*H01L 25/065*   (2023.01)

(52) U.S. Cl.
CPC ........ *H01L 23/544* (2013.01); *H01L 25/0657* (2013.01); *H01L 2223/54486* (2013.01); *H01L 2225/0651* (2013.01); *H01L 2225/06562* (2013.01)

(58) Field of Classification Search
CPC .............. H01L 23/544; H01L 25/0657; H01L 2223/54486; H01L 2225/0651; H01L 2225/06562; H10B 80/00
See application file for complete search history.

(56) References Cited

U.S. PATENT DOCUMENTS

| 10,128,224 B2 | 11/2018 | Park et al. |
| 2019/0221543 A1* | 7/2019 | Sung ...................... H01L 24/09 |

FOREIGN PATENT DOCUMENTS

KR    1020180010378 A    1/2018

* cited by examiner

*Primary Examiner* — Timor Karimy
(74) *Attorney, Agent, or Firm* — WILLIAM PARK & ASSOCIATES LTD.

(57) ABSTRACT

A semiconductor package may include a first die disposed on a package substrate, a second die stacked on the first die, and a first position checker disposed on the package substrate. The first position checker may indicate a first position allowable range in which a first side of the first die can be located.

17 Claims, 15 Drawing Sheets

SEMICONDUCTOR PACKAGES INCLUDING AT LEAST ONE DIE POSITION CHECKER

CROSS-REFERENCE TO RELATED APPLICATIONS

The present application claims priority under 35 U.S.C. 119(a) to Korean Application No. 10-2020-0094286, filed on Jul. 29, 2020, which is incorporated herein by references in its entirety.

BACKGROUND

1. Technical Field

The present disclosure generally relates to a semiconductor packaging technology and, more particularly, to semiconductor packages including at least one die position checker.

2. Related Art

Semiconductor packages are used in various electronic applications. The semiconductor packages can be used for personal computers, mobile phones, or cameras. High-speed operation and large-capacity data processing operation are required for electronic applications and semiconductor packages, and thus a plurality of semiconductor dies are required to be integrated into a single semiconductor package. As a plurality of semiconductor dies are embedded in a semiconductor package, a structure in which semiconductor dies are stacked in three dimensions has been attempted. In order to avoid defects that may be accompanied by such a three-dimensional stack structure, it is required to identify and check positions of the stacked semiconductor dies after stacking the semiconductor dies three-dimensionally.

SUMMARY

According to an aspect, a semiconductor package may include a first die disposed on a package substrate; a second die stacked on the first die; and a first position checker disposed on the package substrate. The semiconductor package may include a second position checker disposed on the package substrate.

The first position checker may indicate a first position allowable range in which a first side of the first die can be located, and the second position checker indicates a second position allowable range in which a second side of the second die can be located.

According to another aspect, a semiconductor package may include a first die disposed on a package substrate; a second die stacked on the first die; a third die stacked on the second die; and first, second, and third position checkers disposed on the package substrate.

In order to indicate a first position allowable range in which a first side of the first die can be located, the first position checker may include a first reference pattern indicating a first reference position where the first side of the first die is to be located; and a first limit pattern spaced apart from the first reference pattern by the first position allowable range.

In order to indicate a second position allowable range in which a second side of the second die can be located, the second position checker may include a second reference pattern indicating a second reference position where the second side of the second die is to be located; and a second upper limit pattern and a second lower limit pattern that are spaced apart from each other with the second reference pattern therebetween.

According to another aspect, a semiconductor package may include a first die disposed on a package substrate; a second die stacked on the first die to be offset in a Y-axis direction; and first and second position checkers disposed on the package substrate.

The first and second position checkers may be disposed to be spaced apart from the first and second dies in the X-axis direction, and the second position checker may be disposed to be spaced apart from the first position checker in the Y-axis direction.

According to an aspect, a semiconductor package may include a first die disposed on a package substrate; a second die stacked on the first die and offset stacked by a distance from the first die; and a first position checker disposed on the package substrate and spaced apart from the first die. The first position checker may indicate a first position allowable range in which a first side of the first die can be located to have a normal separation distance from a second side of the second die.

DETAILED DESCRIPTION

Figure 1:
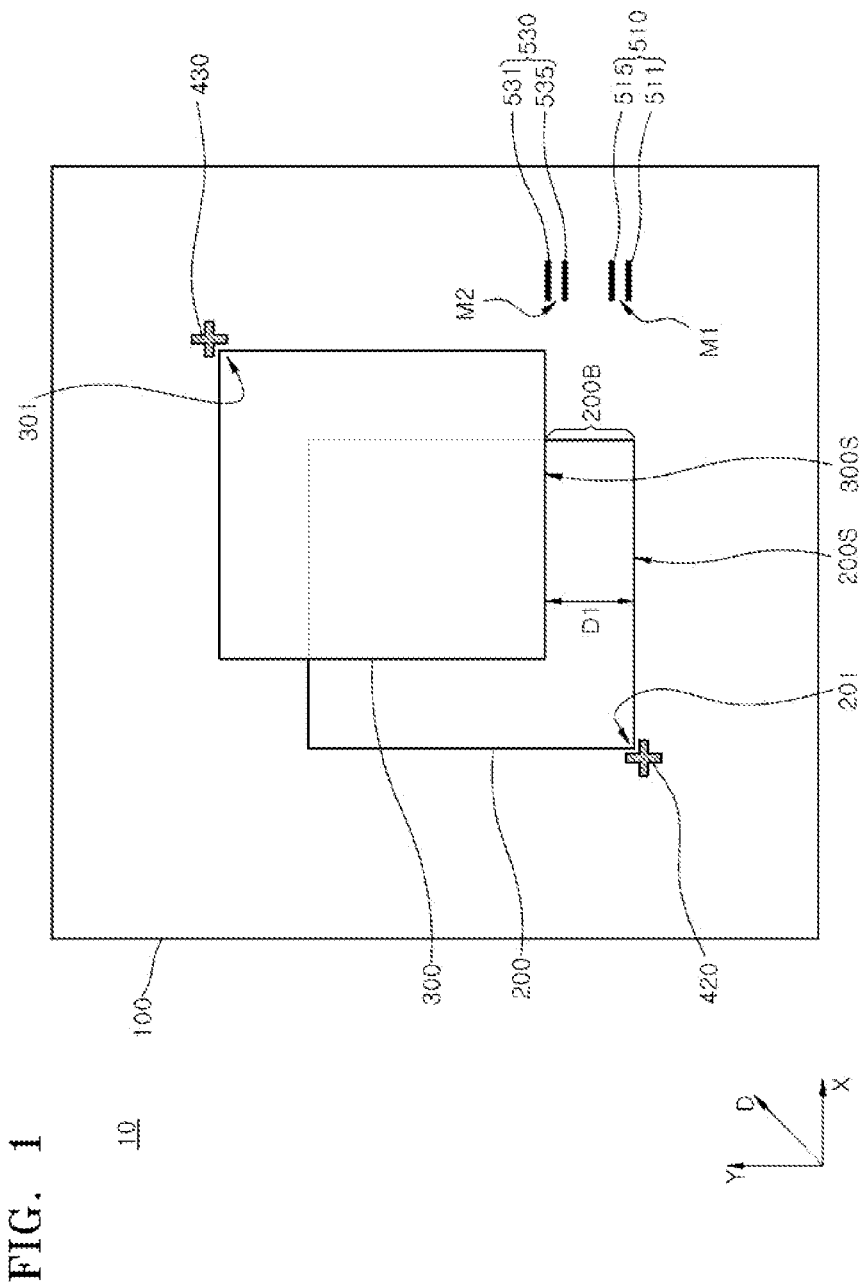
FIG. 1 is a schematic plan view illustrating a semiconductor package according to an embodiment.

The terms used herein may correspond to words selected in consideration of their functions in the embodiments, and the meanings of the terms may be construed to be different according to the intension or custom of the ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

In the description of the examples of the present disclosure, the terms such as "first" and "second", "top" and "bottom or lower" are intended to distinguish the members, but not used to limit the members themselves or to mean specific order. The terms mean a relative positional relationship, but do not limit the specific case where another member is further introduced at or directly in contact with the member. The same interpretation can be applied to other expressions describing the relationship between elements.

Hereinafter, various examples of embodiments will be described below with reference to the accompanying drawings. Various examples of the embodiments are described herein with reference to cross-sectional illustrations that are schematic illustrations of the various examples of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments of the present disclosure may be applied to a technical field for implementing integrated circuits such as dynamic random access memory (DRAM) devices, phase change random access memory (PcRAM) devices, or resistive random access memory (ReRAM) devices. In addition, embodiments of the present disclosure may be applied to a technical field for implementing memory devices such as static random access memory (SRAM) devices, flash memory devices, magnetic random access memory (MRAM) devices or ferroelectric random access memory (FeRAM) devices, or a technical field for implementing a logic device in which a logic integrated circuit is integrated. Embodiments of the present disclosure may be applied to a technical field for implementing various products requiring fine patterns.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a schematic plan view illustrating a semiconductor package 10 according to an embodiment.

Referring to FIG. 1, the semiconductor package 10 may include a package substrate 100, a first die 200, and a second die 300. The first die 200 and the second die 300 may be stacked substantially perpendicular to each other. Each of the first die 200 and the second die 300 may be a semiconductor die in which integrated circuits are integrated. The first die 200 and the second die 300 may be memory semiconductor dies.

The semiconductor package 10 may further include a first position checker 510 and a second position checker 530. The semiconductor package 10 may further include a first fiducial mark 420 and a second fiducial mark 430 disposed on the package substrate 100. Although not illustrated, an encapsulating layer may cover and encapsulate the package substrate 100, the first die 200, and the second die 300.

Figure 2:
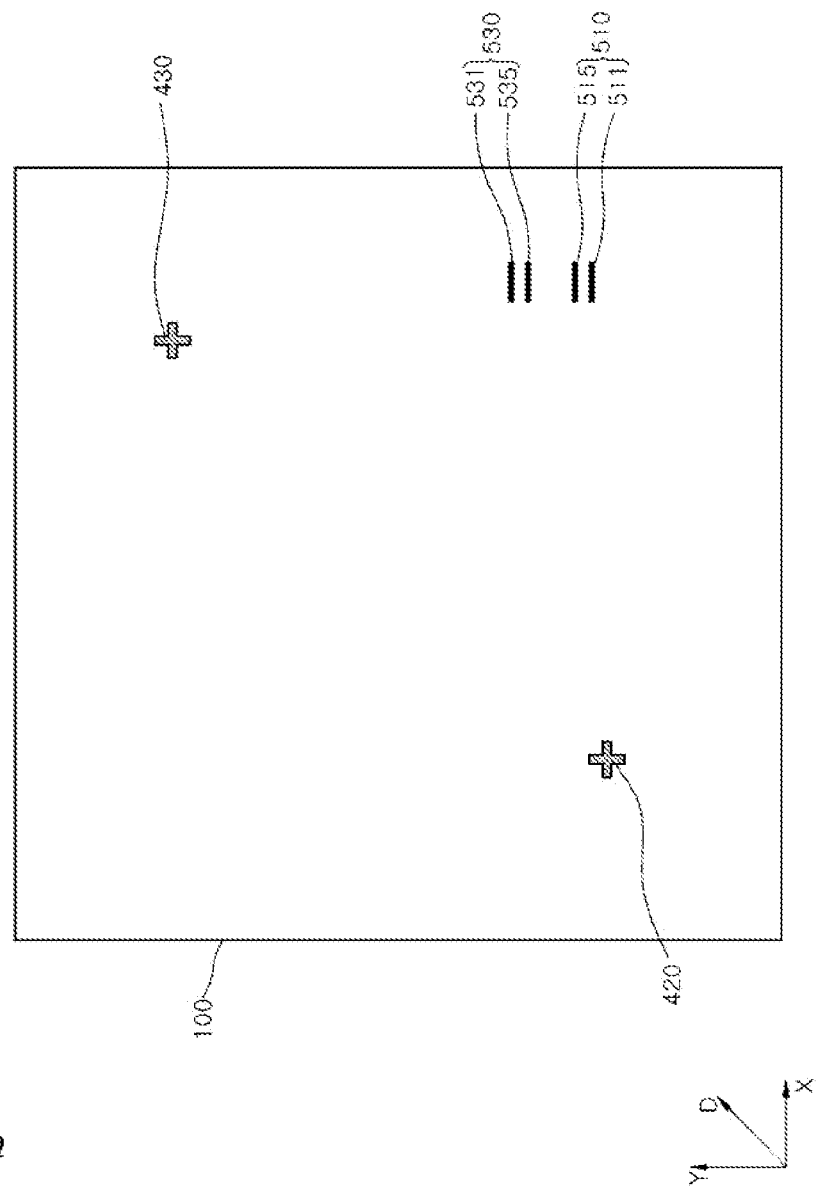
FIG. 2 is a schematic plan view illustrating a package substrate of the semiconductor package of FIG. 1.

FIG. 2 is a schematic plan view illustrating a planar shape of the package substrate 100 of the semiconductor package 10 in FIG. 1.

Referring to FIG. 2 together with FIG. 1, the package substrate 100 may include electrical interconnection structures. The package substrate 100 may electrically connect the semiconductor package (10 of FIG. 1) to an external device, another module board, an external electronic component, and the like. The package substrate 100 may have a form of a printed circuit board (PCB). The first position checker 510 and the second position checker 530 may be disposed on a surface of the package substrate 100. The first fiducial mark 420 and the second fiducial mark 430 may be disposed on the surface of the package substrate 100. The first fiducial mark 420 and the second fiducial mark 430 may be alignment marks with which the first die 200 and the second die 300 are aligned.

Figure 3:
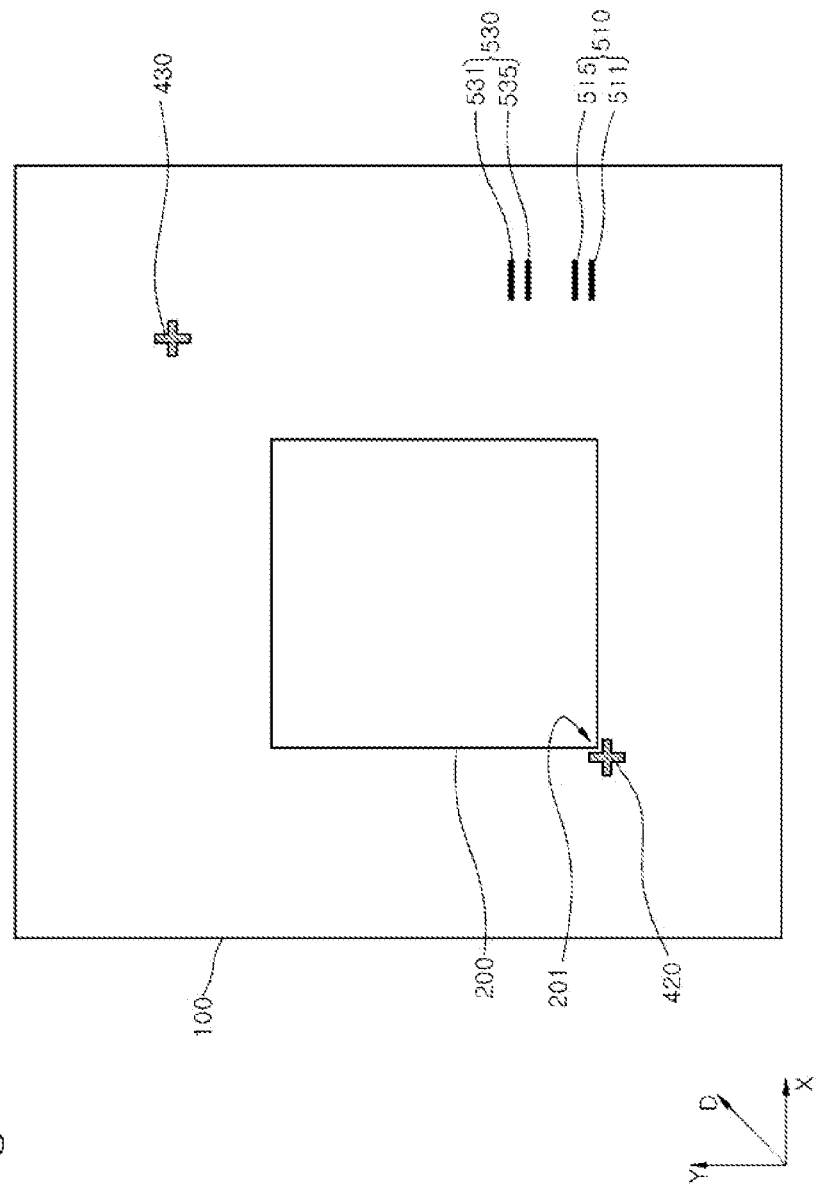
FIG. 3 is a schematic plan view illustrating a planar shape in which a first die is disposed on the package substrate of FIG. 2.

FIG. 3 is a schematic plan view illustrating a planar shape in which the first die 200 is disposed on the package substrate 100 of FIG. 2.

Referring to FIG. 3 together with FIG. 2, the first die 200 may be mounted on the package substrate 100 using the first fiducial mark 420 as a reference point. The first fiducial mark 420 may indicate a position preconfigured such that the first die 200 is disposed on the package substrate 100. While a corner 201 of the first die 200 is aligned with the first fiducial mark 420, the first die 200 may be mounted on the package substrate 100.

Referring to FIG. 3 together with FIG. 1, the first fiducial mark 420 may provide a positional reference point at which the first die 200 is mounted on the package substrate 100, and the second fiducial mark 430 may provide another positional reference point at which the second die 300 is mounted on the first die 200. While a corner 301 of the second die 300 is aligned with the second fiducial mark 430, the second die 300 may be stacked on the first die 200. In an embodiment, the first and second fiducial marks 420 and 430 may be referred to as first and second markers, respectively.

Referring to FIG. 1, the first fiducial mark 420 and the second fiducial mark 430 may be introduced as patterns indicating the positions at which the first die 200 and the second 300 are disposed, respectively, when the first die 200 and the second 300 are disposed on the package substrate 100. The first fiducial mark 420 and the second fiducial mark 430 may be formed as patterns having cross planar shapes. The first fiducial mark 420 and the second fiducial mark 430 may be disposed to be spaced apart from each other in a diagonal direction D on the X-Y plane.

The second die 300 may be offset stacked by a distance from the first die 200. The second die 300 may be offset stacked by a distance from the first die 200 in the diagonal direction D. The second die 300 and the first die 200 may form a step shape and may be offset stacked each other. The second fiducial mark 430 may indicate a positional reference point at which the second die 300 is offset disposed from the first die 200. The word "predetermined" as used herein with respect to a parameter, such as a distance, position, or width, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 4:
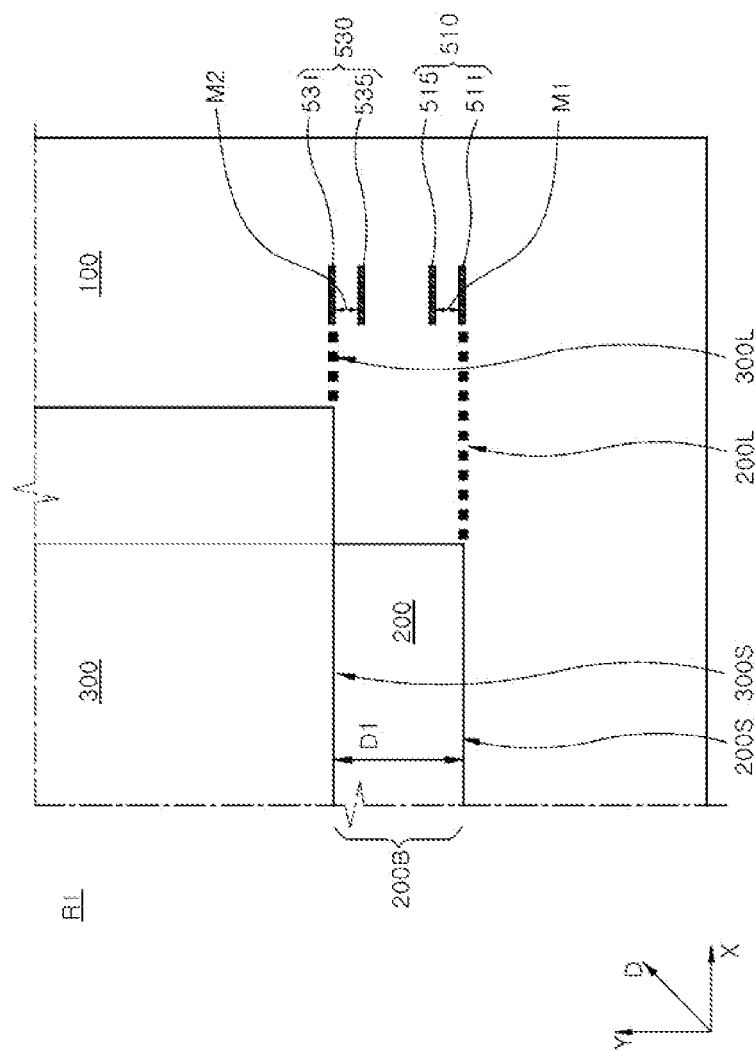
FIG. 4 is a schematic plan view illustrating an enlarged portion of the semiconductor package of FIG. 1, in which first and second position checkers are disposed.

FIG. 4 is a schematic plan view R1 illustrating an enlarged portion of the semiconductor package 10 of FIG. 1 in which first and second position checkers 510 and 530 are disposed.

Referring to FIG. 4, the first position checker 510 and the second position checker 530 may form a group, and may be disposed next to a structure in which the first and second dies 200 and 300 are stacked with each other. As illustrated in FIG. 4, the first position checker 510 and the second position checker 530 may be disposed to be spaced apart from the first and second dies 200 and 300, respectively, in the X-axis direction. In another embodiment, the first position checker 510 and/or the second position checker 530 may be disposed to be in contact with or adjacent to the first and second dies 200 and 300, respectively, in the X-axis direction. However, the first position checker 510 and the second position checker 530 may be disposed at positions not covered by or not overlapping the first and second dies 200 and 300, respectively, in order to check the positions of the first and second dies 200 and 300 after mounting the first and second dies 200 and 300. The first position checker 510 may be a checking mark indicating a first position allowable range M1 in which the first die 200 can be located. The first position checker 510 may indicate the first position allowable range M1 in which a first side 200S, which is a side of the first die 200, can be located.

The second position checker 530 may be a checking mark indicating a second position allowable range M2 in which the second die 300 can be located. The second position checker 530 may indicate the second position allowable range M2 in which a second side 300S, which is a side of the second die 300, can be located. The first side 200S of the first die 200 may be a side extending in the X-axis direction on the X-Y plane, and the second side 300S of the second die 300 may be a side extending while facing the same direction as the first side 200S of the first die 200.

The first position checker 510 and the second position checker 530 may be configured as patterns displayed on the surface of the package substrate 100. The first position checker 510 and the second position checker 530 may be formed in shapes that are visually distinguished or distinguished by images. The first position checker 510 and the second position checker 530 may be formed in recessed groove shapes on the surface of the package substrate 100, shapes protruding from the surface, or conductive dummy patterns.

The first position checker 510 may be composed of a plurality of patterns indicating the first position allowable range M1. The first position checker 510 may include a first reference pattern 511 and a first limit pattern 515. The first reference pattern 511 may indicate a first reference position 200L that may be an ideal position at which the first side 200S of the first die 200 is to be located. The first reference pattern 511 may be disposed on a virtual line indicating the first reference position 200L. If the first side 200S of the first die 200 is located on the line of the first reference position 200L, it can be evaluated or identified that the first die 200 is actually disposed at an ideal position, which is a predesigned position.

The first limit pattern 515 may be spaced apart from the first reference pattern 511 by the first position allowable range M1. The first limit pattern 515 may be located at a position spaced apart from the first reference pattern 511 in the Y-axis direction perpendicular to the first side 200S of the first die 200. The first limit pattern 515 may be introduced as a pattern forming a pair with the first reference pattern 511. The first limit pattern 515 may be formed in substantially the same shape as the first reference pattern 511. The first reference pattern 511 and the first limit pattern 515 may be patterns having line shapes extending parallel to each other. These line shapes may extend in the X-axis direction in which the first side 200S of the first die 200 extends.

The second position checker 530 may be composed of a plurality of patterns indicating the second position allowable range M2. The second position checker 530 may have a shape of a substantially mirror image with the first position checker 510. The second position checker 530 may include a second reference pattern 531 and a second limit pattern 535. The second reference pattern 531 may indicate a second reference position 300L that may be an ideal position at which the second side 300S of the second die 300 is to be located. The second reference pattern 531 may be disposed on a virtual line indicating the second reference position 300L. If the second side 300S of the second die 300 is located on the line of the second reference position 300L, it can be evaluated or identified that the second die 300 is actually disposed at an ideal position, which is a predesigned position.

The second die 300 may be offset stacked on the first die 200 so that a portion 200B of the first die 200 adjacent to the first side 200S of the first die 200 is exposed outside the second side 300S of the second die 300. If it is identified that the second side 300S of the second die 300 is located on the line of the second reference position 300L, and the first side 200S of the first die 200 is located on the line of the first reference position 200L, it can be evaluated that the second side 300S of the second die 300 is spaced apart from the first side 200S of the first die 200 by a normal separation distance. It can be identified that the portion 200B of the first die 200 exposed by the second die 300 normally secures the width D1 equal to the separation distance. In an embodiment, it can be identified that the portion 200B of the first die 200 exposed by the second die 300 secures the width D1 which is equal to the separation distance needed for the first and second dies 200 and 300 to normally operate and communicate with one another. In some embodiments, the width D1 may be a normal separation distance needed for the first and second dies 200 and 300 to normally operate and communicate with one another. In some embodiments, the first position checker 510 indicates a first position allowable range M1 in which a first side 200S of the first die 200 can be located to have a normal separation distance (i.e., D1) from a second side 300S of the second die 300.

The second limit pattern 535 may be spaced apart from the second reference pattern 531 by the second position allowable range M2. The second limit pattern 535 may be located at a position spaced apart from the second reference pattern 531 in the Y-axis direction perpendicular to the second side 300S of the second die 300. The second limit pattern 535 may be located at a position spaced apart from the second reference pattern 531 toward the first limit pattern 515. The first limit pattern 515 and the second limit pattern 535 may be disposed to face each other between the first reference pattern 511 and the second reference pattern 531. The first reference pattern 511 and the second reference pattern 531 may have substantially the same shape. The first limit pattern 515 and the second limit pattern 535 may have substantially the same shape.

The second limit pattern 535 may be introduced as a pattern forming a pair with the second reference pattern 531. The second limit pattern 535 may be formed to have substantially the same shape as the second reference pattern 531. The second reference pattern 531 and the second limit pattern 535 may be patterns having line shapes extending parallel to each other. These line shapes may extend in the X-axis direction in which the second side 300S of the second die 300 extends.

Figure 5:
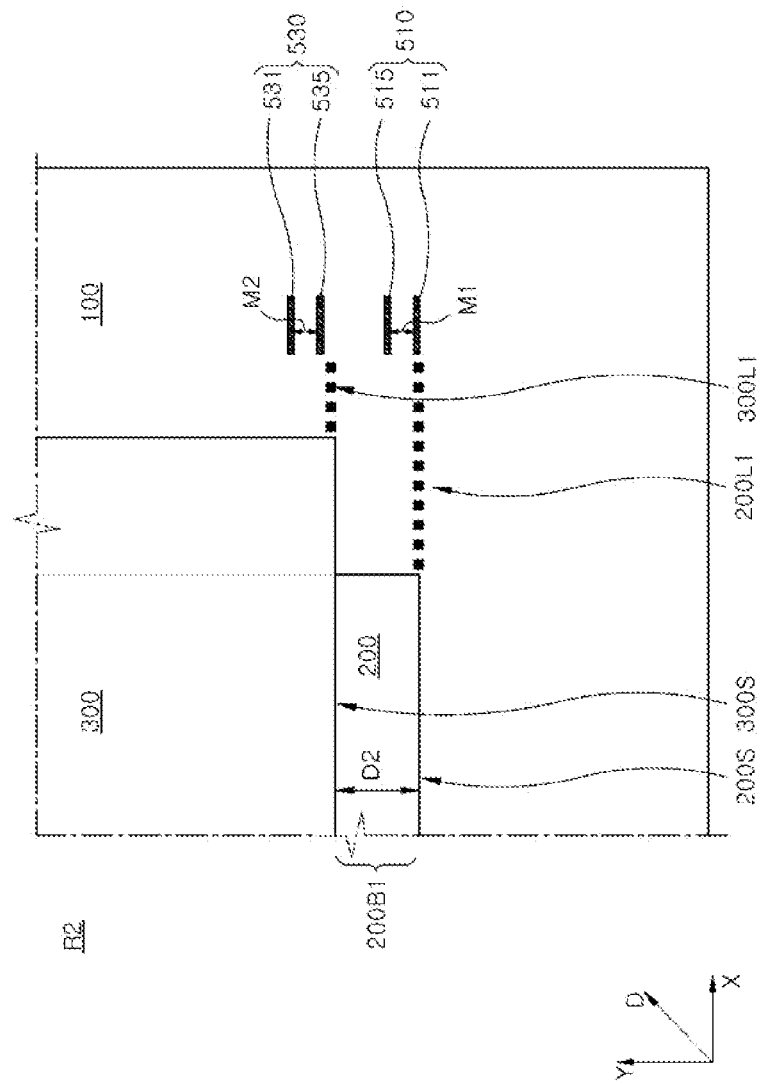
FIG. 5 is a schematic plan view illustrating a die stack failure according to an example.

FIG. 5 is a schematic plan view R2 illustrating a die stack failure according to an example.

Referring to FIG. 5, after the first die 200 is mounted on the package substrate 100, the actually disposed position of the first die 200 may be checked using the first position checker 510. As illustrated in FIG. 5, if it is observed that the first virtual line 200L1 indicating the first side 200S of the first die 200 is located on the first reference pattern 511, it may be evaluated that the first side 200S of the first die 200 is located within the first position allowable range M1.

After the second die 300 is mounted on the first die 200, the actual stack position of the second die 300 may be checked using the second position checker 530. If it is observed that the second virtual line 300L1 indicating the second side 300S of the second die 300 deviates from between the second reference pattern 531 and the second limit pattern 535 and is located between the second limit pattern 535 and the first limit pattern 515, it may be evaluated that the second side 300S of the second die 300 is out of the second position allowable range M2.

As such, even if the first side 200S of the first die 200 is located within the first position allowable range M1, the second side 300S of the second die 300 may deviate from the second position allowable range M2. Even if the second die 300 is stacked based on the second fiducial mark (430 in FIG. 1), the actual stack position of the second die 300 may deviate from a position due to various variables that may be involved in the stacking process. If the second side 300S of the second die 300 deviates from the second position allowable range M2, the portion 200B1 of the first die 200 exposed outside the second side 300S of the second die 300 may have a defective width D2 that is narrower than the width (D1 in FIG. 1). When the exposed portion 200B1 of the first die 200 has the narrow defective width D2, the possibility of causing a collision failure in a subsequent wire bonding process increases.

As such, even if the first side 200S of the first die 200 is located within the first position allowable range M1, if it is observed that the second side 300S of the second die 300 deviates from the second position allowable range M2, it may be determined that a die stack failure has occurred.

Figure 6:
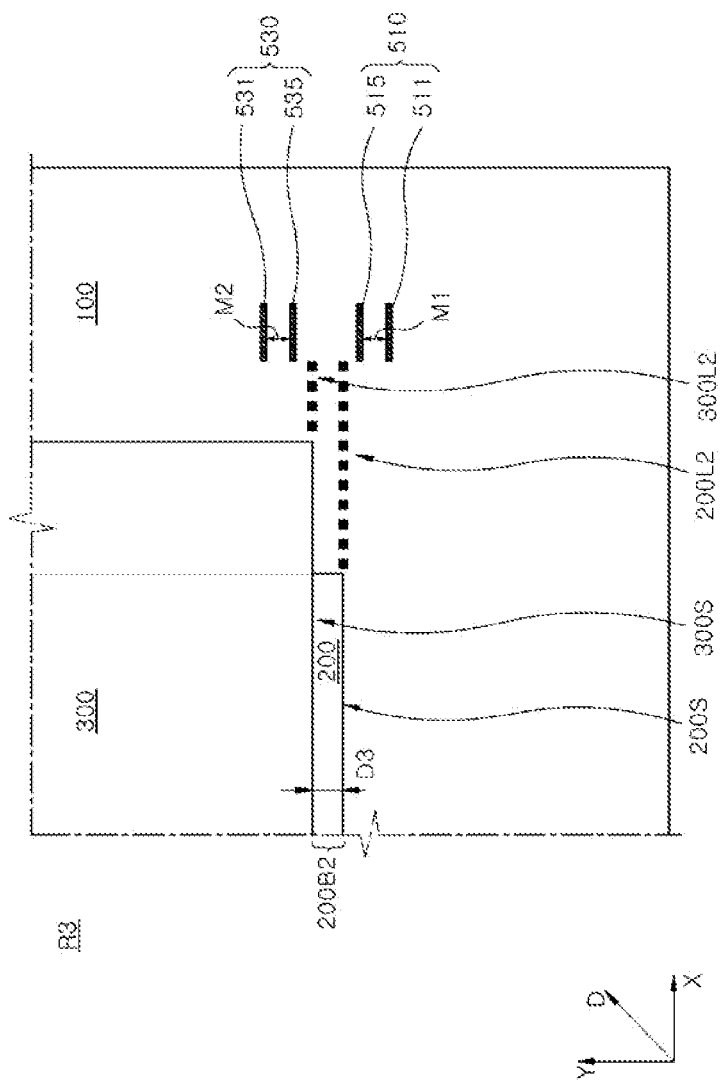
FIG. 6 is a schematic plan view illustrating a die stack failure according to an example.

FIG. 6 is a schematic plan view R3 illustrating a die stack failure according to an example.

Referring to FIG. 6, after a first die 200 is mounted on a package substrate 100, the actual mounting position of the first die 200 may be checked using a first position checker 510. If it is observed that a third virtual line 200L2 indicating a first side 200S of the first die 200 deviates from between the first limit pattern 515 and the first reference pattern 511, and is located between a second limit pattern 535 and the first limit pattern 515, it may be evaluated that the first side 200S of the first die 200 is located outside a first position allowable range M1.

After a second die 300 is mounted on the first die 200, the actual stack position of the second die 300 may be checked using a second position checker 530. If it is observed that a fourth virtual line 300L2 indicating a second side 300S of the second die 300 deviates from between the second limit pattern 535 and the first reference pattern 511, and is located between the second limit pattern 535 and the first limit pattern 515, it may be evaluated that the second side 300S of the second die 300 is located outside a second position allowable range M2.

As such, if it is observed that the first side 200S of the first die 200 and the second side 300S of the second die 300 deviate from the first and second position allowable ranges M1 and M2, respectively, it may be determined that a die stack failure has occurred. A portion 200B2 of the first die 200 exposed outside the second side 300S of the second die 300 has a defective width D3 that is much narrower than a width (D1 in FIG. 1). If the portion 200B2 of the first die 200 is exposed with such a narrow width D3, the possibility of causing a collision failure in a subsequent wire bonding process may become very high.

Figure 7:
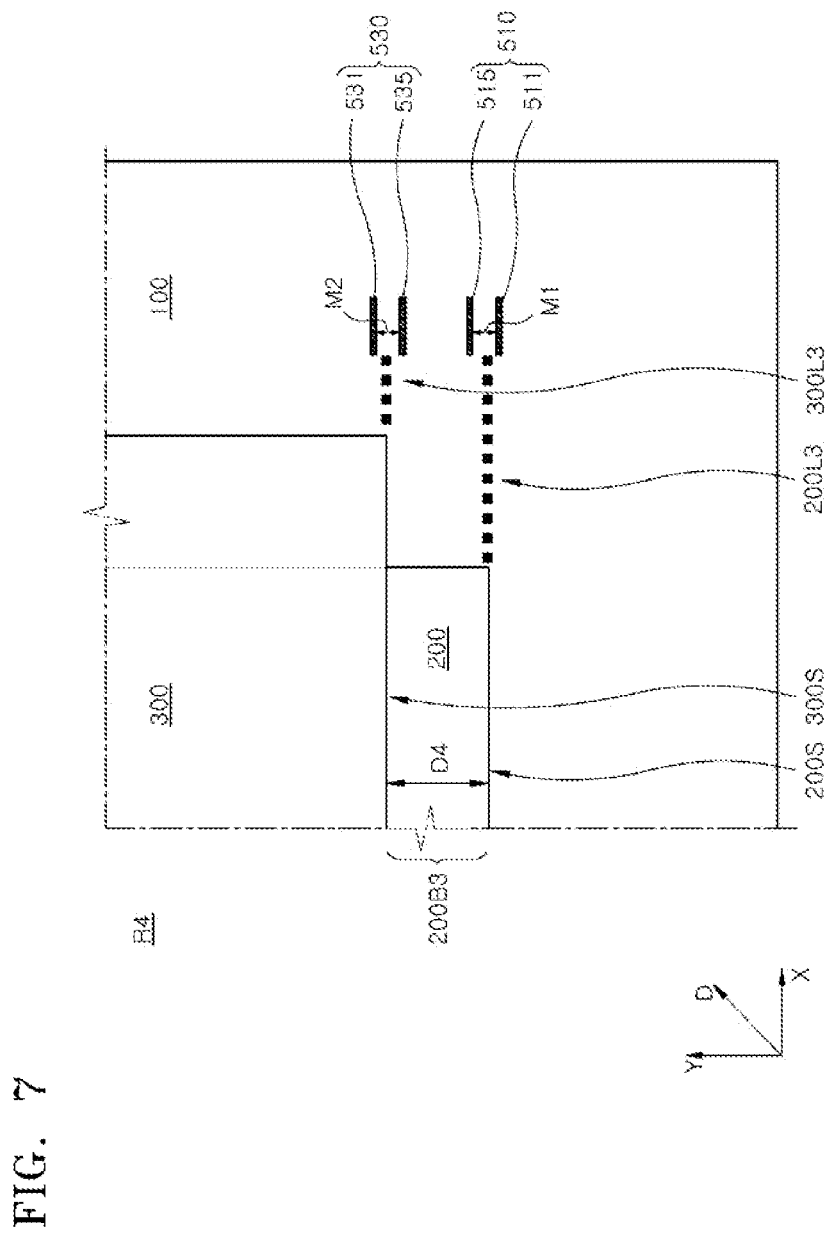
FIG. 7 is a schematic plan view illustrating a die stack shape in a normal state according to an example.

FIG. 7 is a schematic plan view R4 illustrating a die stack in a normal state according to an example.

Referring to FIG. 7, after a first die 200 is mounted on a package substrate 100, the actual mounting position of the first die 200 may be checked using a first position checker 510. If it is observed that a fifth virtual line 200L3 indicating a first side 200S of the first die 200 is located between a first reference pattern 511 and a first limit pattern 515, it may be evaluated that the first side 200S of the first die 200 is located within a first position allowable range M1.

After a second die 300 is mounted on the first die 200, the actual mounting position of the second die 300 may be checked using a second position checker 530. If it is observed that a sixth virtual line 300L3 indicating a second side 300S of the second die 300 is located between a second limit pattern 535 and a second reference pattern 531, it may be evaluated that the second side 300S of the second die 300 is located within a second position allowable range M2.

As such, if it is observed that the first side 200S of the first die 200 and the second side 300S of the second die 300 are located within the first and second position allowable ranges M1 and M2, respectively, it may be determined that the die stack state is in a normal state. A portion 200B3 of the first die 200, exposed outside the second side 300S of the second die 300 may have a slightly narrower width D4 than the width (D1 in FIG. 1), but failures can be limited and prevented in the subsequent wire bonding process.

Figure 8:
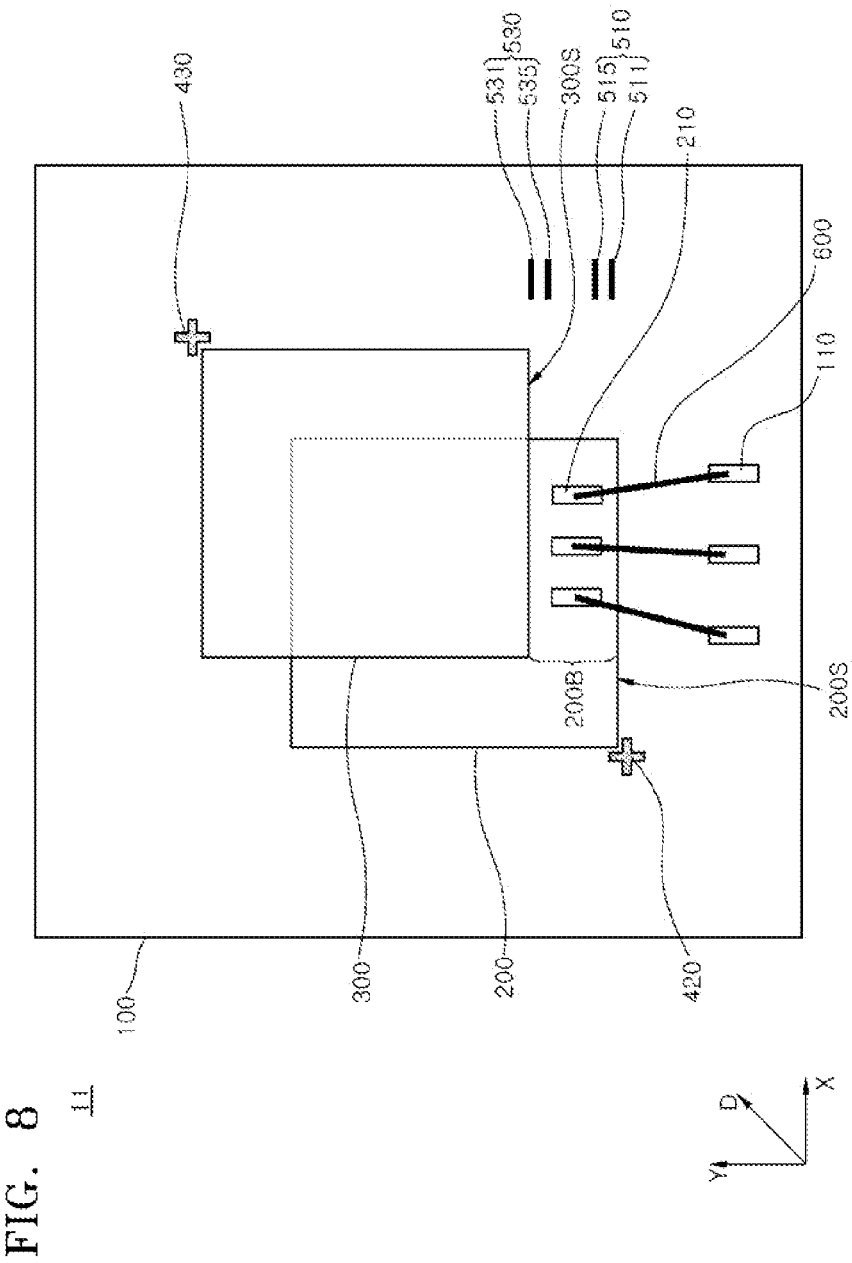
FIG. 8 is a schematic plan view illustrating a semiconductor package according to an embodiment.

FIG. 8 is a schematic plan view illustrating a semiconductor package 11 according to an embodiment. In FIG. 8, reference numerals indicated in the same manner as in FIG. 1 may be understood to mean the same members.

Referring to FIG. 8, the semiconductor package 11 may include a package substrate 100, a first die 200, and a second die 300. The semiconductor package 11 may further include a first position checker 510, and a second position checker 530. The semiconductor package 11 may further include a first fiducial mark 420 and a second fiducial mark 430.

A portion 200B of the first die 200, adjacent to a first side 200S of the first die 200 may be exposed outside a second side 300S of the second die 300. Bonding pads 210 may be disposed at the portion 200B of the first die 200. The bonding pads 210 may be terminals electrically connected to the first die 200. The package substrate 100 may further include bonding fingers 110. Bonding wires 600 may connect the bonding fingers 110 to the bonding pads 210.

Figure 9:
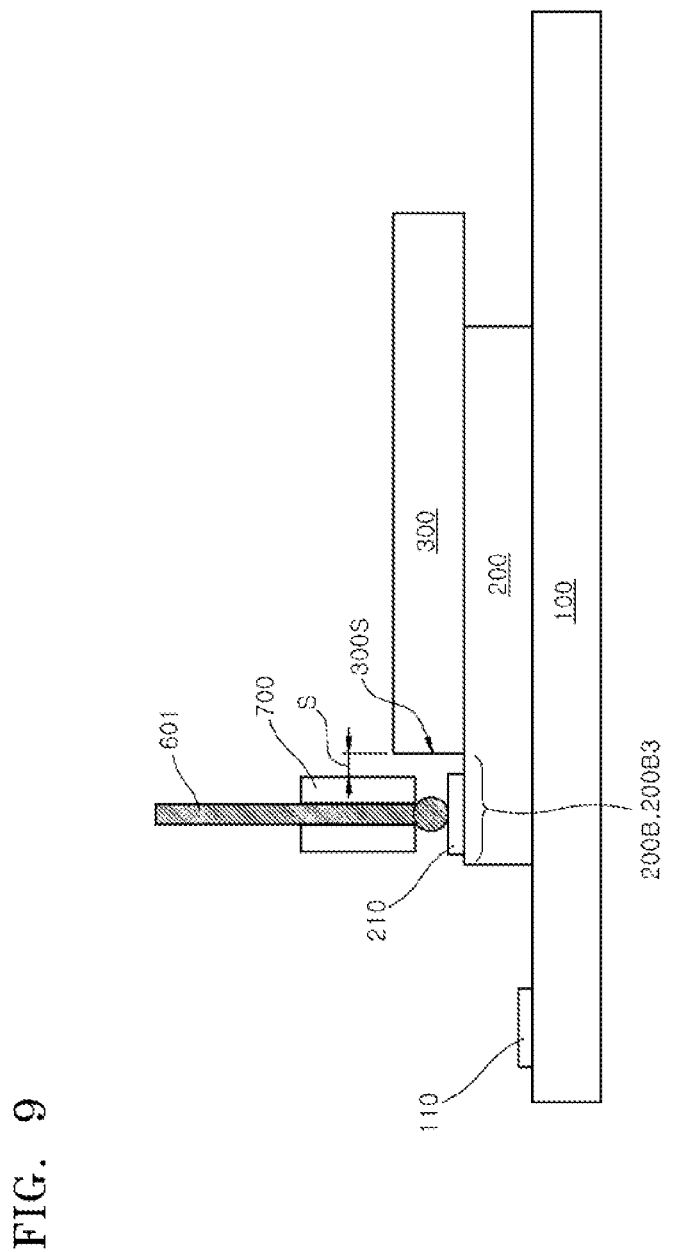
FIG. 9 is a schematic cross-sectional view illustrating a wire bonding process according to an embodiment.
Figure 10:
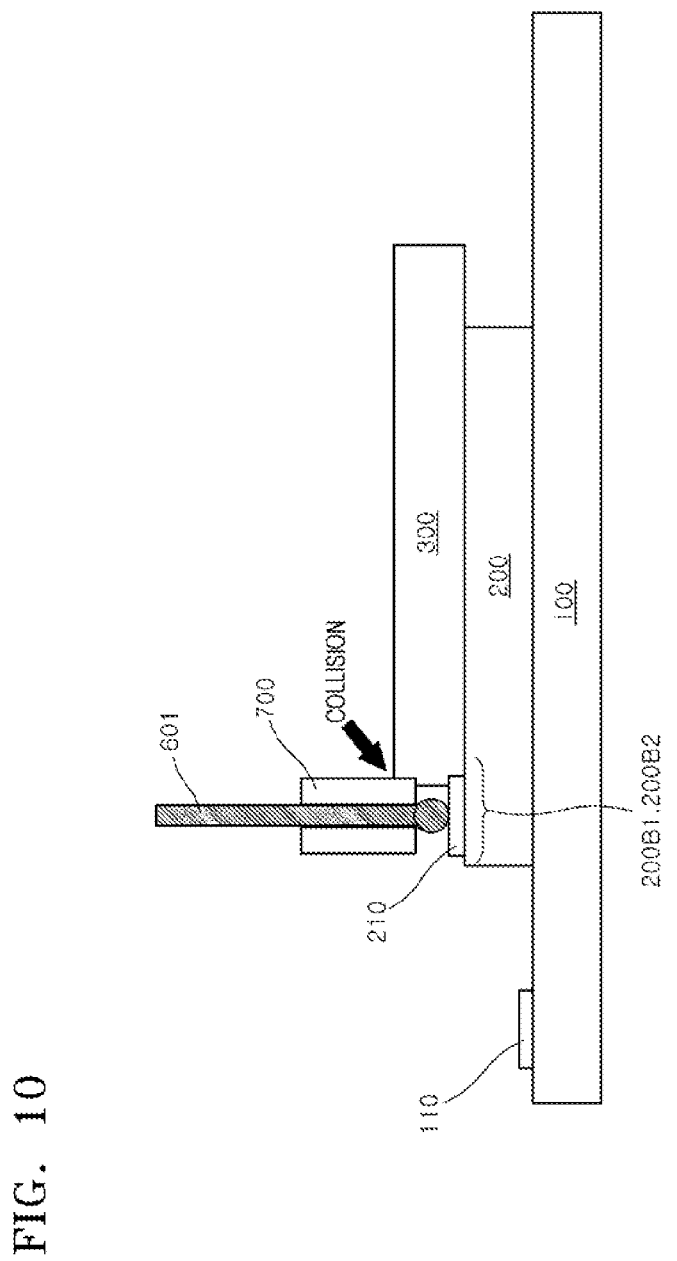
FIG. 10 is a schematic cross-sectional view illustrating an example of a collision failure that may occur during a wire bonding process according to an example.

FIG. 9 is a schematic cross-sectional view illustrating a wire bonding process step according to an embodiment. FIG. 10 is a schematic cross-sectional view illustrating an example of a collision failure that may occur during a wire bonding process step according to an example.

Referring to FIG. 9 together with FIG. 8, the bonding wire process may be performed such that the bonding wires 600 connect the bonding fingers 110 to the bonding pads 210. A capillary 700 of a wire bonding device may lead a wire 601 and bond the wire to the bonding pad 210 of the first die 200. In order to contact an end portion of the wire 601 to the bonding pad 210, the capillary 700 may be lowered to the side of the second side 300S of the stacked second die 300. In order to prevent the capillary 700 from colliding with the second die 300, the capillary 700 needs to be spaced apart from the second side 300S of the second die 300 by a distance S. In order for the capillary 700 and the second side 300S of the second die 300 to be spaced apart by the distance S, a portion 200B of the first die 200, exposed outside the second side 300S of the second die 300 should be secured to have a width or more. To this end, it may be required to inspect and check the position of the second side 300S of the stacked second die 300.

As described above with reference to FIGS. 4 and 7, if it is identified that the widths D1 and D4 of portions 200B and 200B3 of the first die 200, exposed outside the second side 300S of the second die 300 are normally secured, the wire bonding process can be performed without a failure in which the capillary 700 collides with the second die 300.

As described above with reference to FIGS. 5 and 6, if the widths D2 and D3 of the portions 200B1 and 200B2 of the first die 200, exposed outside the second side 300S of the second die 300 cannot be sufficiently secured, a failure in which the capillary 700 collides with the second die 300 may occur, as shown in FIG. 10. In order to prevent the collision failure of the capillary 700 in advance, it is required to check in advance the widths D1, D4 or D2, D3 of the portions 200B, 200B3 or 200B1, 200B2 of the first die 200, exposed outside the second side 300S of the second die 300. In order to check in advance the width D1, D4 or D2, D3 of the portions 200B, 200B3 or 200B1, 200B2 of the first die 200, exposed outside the second side 300S of the second die 300, it is required to check and inspect the positions of the first side 200S of the first die 200 and the second side 300S of the second die 300 using the first and second position checkers 510 and 530 in advance.

Figure 11:
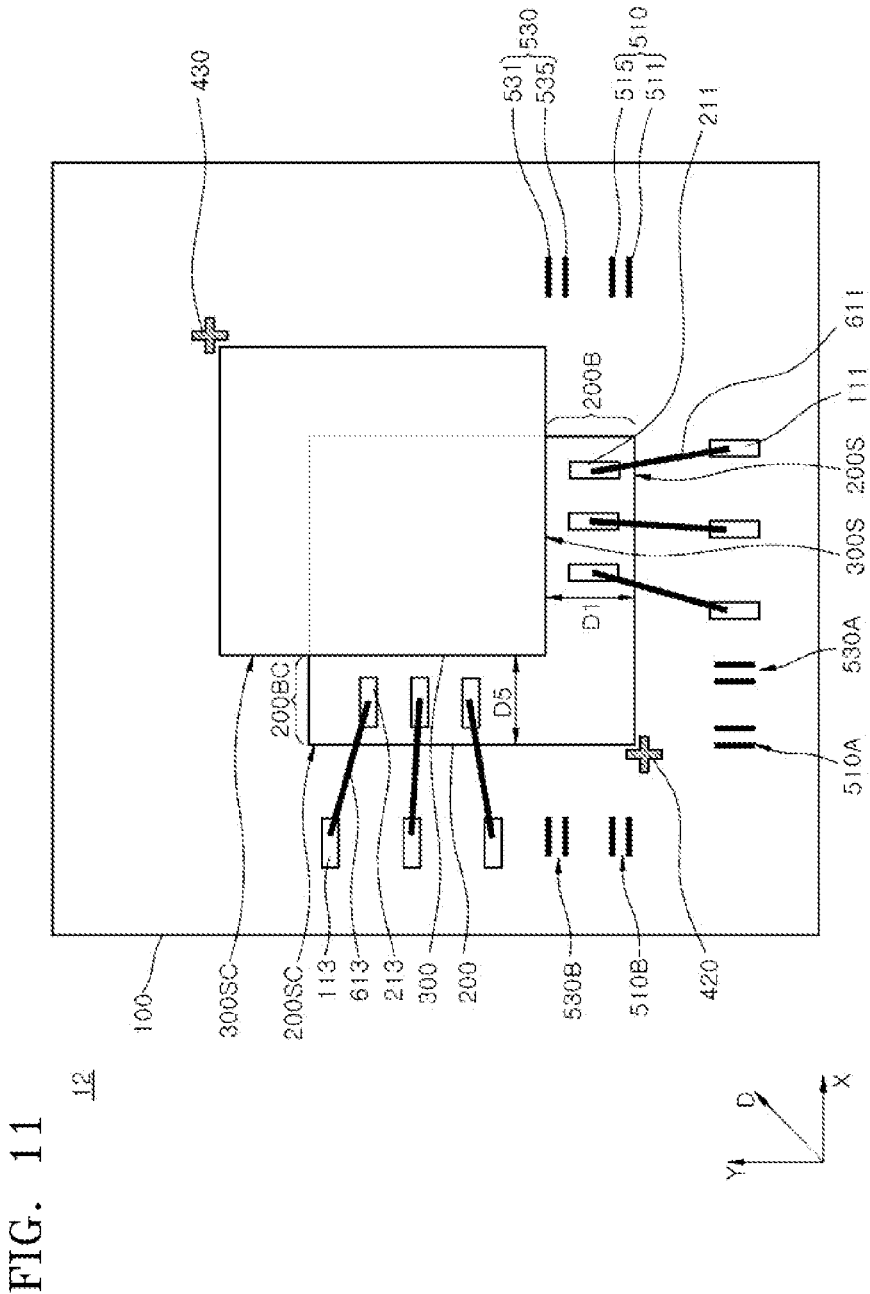
FIG. 11 is a schematic plan view illustrating a semiconductor package according to an embodiment.

FIG. 11 is a schematic plan view illustrating a semiconductor package 12 according to an embodiment. In FIG. 11, reference numerals indicated in the same manner as in FIG. 1 may be understood to mean the same members.

Referring to FIG. 11, the semiconductor package 12 may include a package substrate 100, a first die 200, and a second die 300. The second die 300 may be vertically stacked on the first die 200 to be offset by a distance in the diagonal direction D. The semiconductor package 12 may include a first position checker 510 and a second position checker 530, and may further include a third position checker 510A and a fourth position checker 530A. The third position checker 510A and the fourth position checker 530A may each have a shape in which the first position checker 510 and the second position checker 530 are rotated at an angle of 90 degrees in the X-Y plane. The third position checker 510A may have a shape substantially the same as a shape in which the first position checker 510 including a first reference pattern 511 and a first limit pattern 515 is rotated at an angle of 90 degrees. The fourth position checker 530A may have a shape substantially the same as a shape in which the second position checker 530 including a second reference pattern 531 and a second limit pattern 535 is rotated at an angle of 90 degrees.

The third position checker 510A may indicate a third position allowable range in which a third side 200SC of the first die 200 can be located. The third side 200SC of the first die 200 may be a side crossing the first side 200S at an angle of 90 degrees. The fourth position checker 530A may indicate a fourth position allowable range in which a fourth side 300SC of the second die 300 can be located. The fourth side 300SC of the second die 300 may be a side crossing the second side 300S at an angle of 90 degrees.

The third position checker 510A and the fourth position checker 530A may be used to check and inspect the positions of the third side 200SC of the first die 200 and the fourth side 300SC of the second die 300. The size of the exposed width D5 of another portion 200BC of the first die 200, which is exposed outside the fourth side 300SC of the second die 300 and is adjacent to the third side 200SC of the first die 200 can be evaluated and checked using the third position checker 510A and the fourth position checker 530A.

The semiconductor package 12 may further include a fifth position checker 510B and a sixth position checker 530B. The fifth position checker 510B and the sixth position checker 530B may be located at positions apposite to the positions in which the first and second position checkers 510 and 530 are located, interposing the first and second dies 200 and 300. The fifth position checker 510B and the sixth position checker 530B may each have substantially the same shape as the first and second position checkers 510 and 530. The fifth position checker 510B and the sixth position checker 530B can check and evaluate the positions of the first side 200S of the first die 200 and the second side 300S of the second die 300 at opposite sides of the first and second position checkers 510 and 530. It is possible to check and evaluate the degrees of tilt of the first die 200 and the second die 300 by checking and evaluating the positions of the first side 200S of the first die 200 and the second side 300S of the second die 300 from both sides.

A portion 200B of the first die 200, adjacent to the first side 200S of the first die 200 may be exposed outside the second side 300S of the second die 300. First bonding pads 211 may be disposed in the portion 200B of the first die 200. The first bonding pads 211 may be terminals electrically connected to the first die 200 like the bonding pads 210 illustrated in FIG. 8. The package substrate 100 may further include first bonding fingers 111. First bonding wires 611 may connect the first bonding fingers 111 to the first bonding pads 211. The first bonding fingers 111 and the first bonding wires 611 may be understood as substantially the same members as the bonding fingers 110 and the bonding wires 600 shown in FIG. 8. The plurality of first bonding pads 211, the plurality of first bonding fingers 111, and the plurality of first bonding wires 611 may be disposed in columns, respectively, along the X-axis direction on the X-Y plane.

Another portion 200BC of the first die 200, adjacent to the third side 200SC of the first die 200 may be exposed outside the fourth side 300SC of the second die 300. Second bonding pads 213 may be disposed in another portion 200BC of the first die 200. The second bonding pads 213 may be other terminals electrically connected to the first die 200. The package substrate 100 may further include second bonding fingers 113. Second bonding wires 613 may connect the second bonding fingers 113 to the second bonding pads 213. The plurality of second bonding pads 213, the plurality of second bonding fingers 113, and the plurality of second bonding wires 613 may be arranged in columns along the Y-axis direction on the X-Y plane. The plurality of second bonding pads 213, the plurality of second first bonding fingers 113, and the plurality of second first bonding wires 613 may be arranged in columns, respectively, along the third side 200SC of the first die 200 and the fourth side 300SC of the second die 300.

Figure 12:
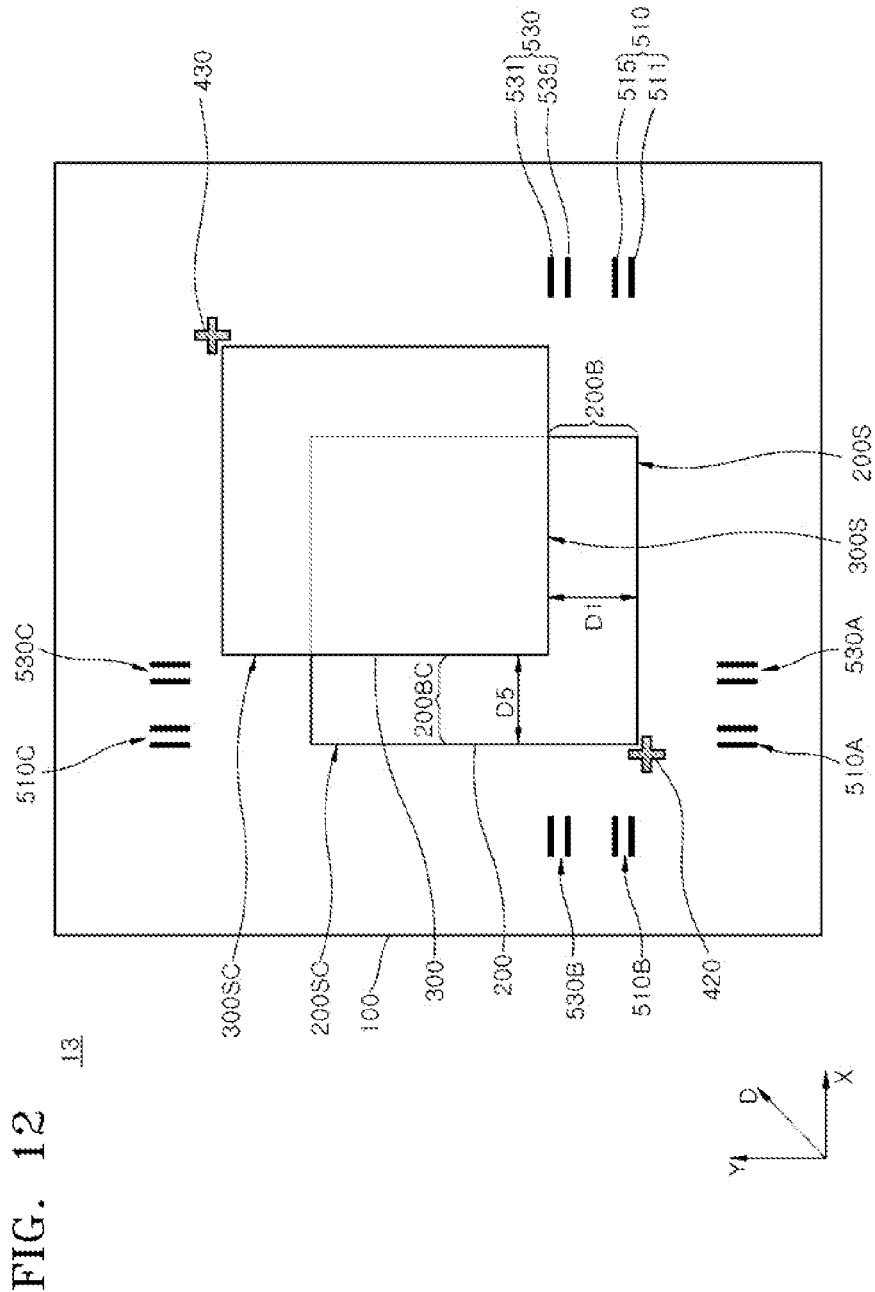
FIG. 12 is a schematic plan view illustrating a semiconductor package according to an embodiment.

FIG. 12 is a schematic plan view illustrating a semiconductor package 13 according to an embodiment. In FIG. 12, reference numerals indicated in the same manner as in FIG. 11 may be understood to mean the same members.

Referring to FIG. 12, the semiconductor package 13 may include a package substrate 100, a first die 200, and a second die 300. The second die 300 may be vertically stacked on the first die 200 to be offset by a distance in the diagonal direction D. The semiconductor package 13 may include a first position checker 510 and a second position checker 530, and may further include a third position checker 510A and a fourth position checker 530A. The semiconductor package 13 may further include a fifth position checker 510B and a sixth position checker 530B. The semiconductor package 13 may further include a seventh position checker 510C and an eighth position checker 530C.

The seventh position checker 510C and the eighth position checker 530C may be disposed at opposite positions to the third and fourth position checkers 510A and 530A, interposing the first and second dies 200 and 300. The seventh position checker 510C and the eighth position checker 530C may each have substantially the same shape as the third and fourth position checkers 510A and 530A, respectively. The seventh position checker 510C and the eighth position checker 530C may be used to check and evaluate the positions of the third side 200SC of the first die 200 and the fourth side 300SC of the second die 300 at opposite sides to the third and fourth position checkers 510A and 530A. It is possible to check and evaluate the degree of tilt of the first die 200 and the second die 300 by checking and evaluating the positions of the third side 200SC of the first die 200 and the fourth side 300SC of the second die 300 from both sides.

Figure 13:
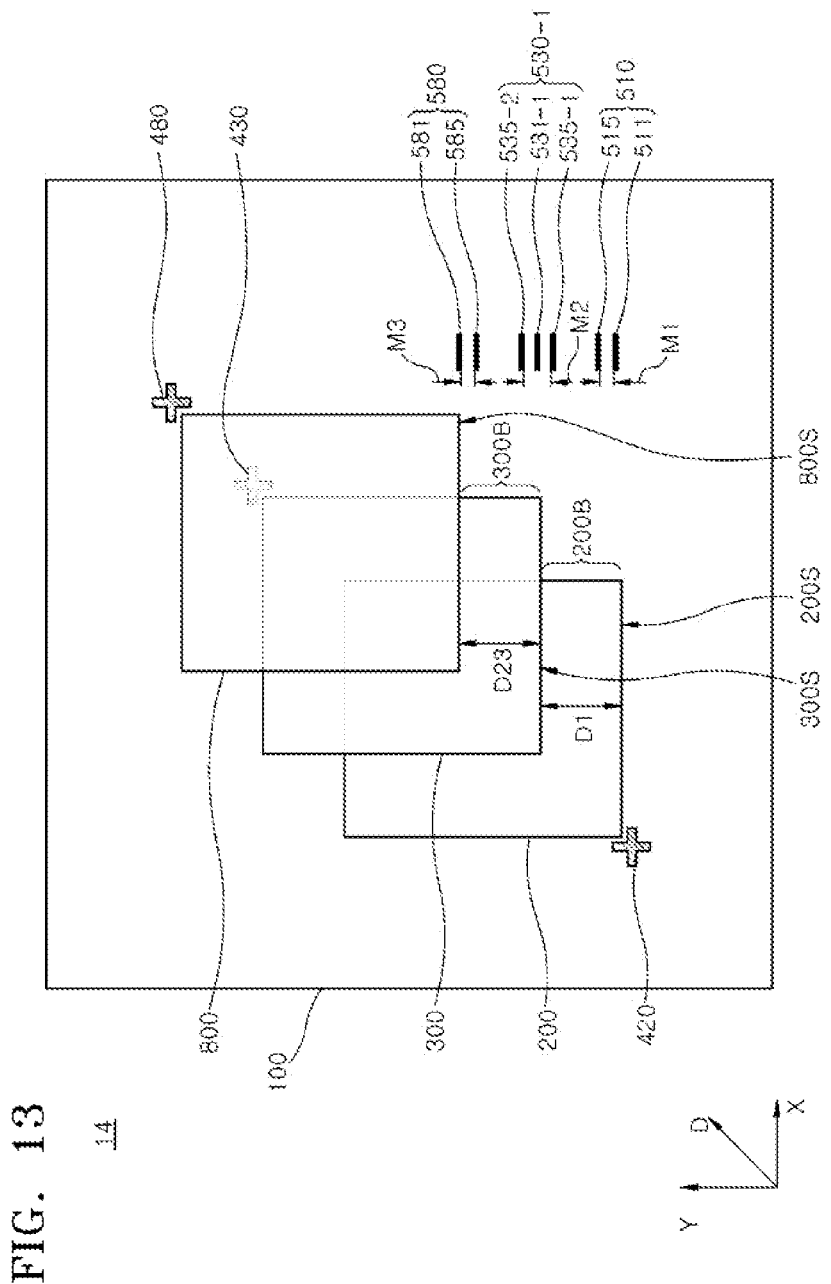
FIG. 13 is a schematic plan view illustrating a semiconductor package according to an embodiment.

FIG. 13 is a schematic plan view illustrating a semiconductor package 14 according to an embodiment. In FIG. 13, reference numerals indicated in the same manner as in FIG. 1 may be understood to mean the same members.

Referring to FIG. 13, the semiconductor package 14 may include a package substrate 100, a first die 200, a second die 300, and a third die 800. The semiconductor package 14 may further include a first fiducial mark 420, a second fiducial mark 430, and a third fiducial mark 480. The first fiducial mark 420 may indicate a position reference point at which the first die 200 is to be mounted when the first die 200 is mounted on the package substrate 100. The second fiducial mark 430 may indicate a position reference point at which the second die 300 is to be stacked when the second die 300 is offset stacked on the first die 200. The third fiducial mark 480 may indicate a position reference point at which the third die 800 is to be stacked when the third die 800 is offset stacked on the second die 300.

The second die 300 may be offset stacked on the first die 200 so that a portion 200B of the first die 200, adjacent to the first side 200S of the first die 200 is exposed outside the second side 300S of the second die 300. The third die 800 may be offset stacked on the second die 300 such that a portion 300B of the second die 300, adjacent to the second side 300S of the second die 300 is exposed outside a third side 800S of the third die 800. The third side 800S of the third die 800 may indicate a different side from the third side 200SC of the first die 200 of FIG. 11.

The semiconductor package 14 may further include a first position checker 510, a second position checker 530-1, and a third position checker 580. The first position checker 510 may be configured to indicate a first position allowable range M1 in which the first side 200S of the first die 200 can be located. The first position checker 510 may include a first reference pattern 511 and a first limit pattern 515. The first limit pattern 515 may be spaced apart from the first reference pattern 511 by the first position allowable range M1 in the Y-axis direction.

The second position checker 530-1 may be configured to indicate a second position allowable range M2 in which the second side 300S of the second die 300 can be located. The second position checker 530-1 may include a second reference pattern 531-1, a second lower limit pattern 535-1, and a second upper limit pattern 535-2. The second lower limit pattern 535-1 and the second upper limit pattern 535-2 may be disposed to be spaced apart from each other by the second position allowable range M2 in the Y-axis direction. The second reference pattern 531-1 may be disposed to indicate a second reference position at which the second side 300S of the second die 300 is to be located. The second lower limit pattern 535-1 and the second upper limit pattern 535-2 may be disposed at opposite sides to each other, interposing the second reference pattern 531-1 therebetween. The second lower limit pattern 535-1 and the second upper limit pattern 535-2 may be spaced apart by substantially the same distance from the second reference pattern 531-1 disposed therebetween. As such, the second position checker 530-1 may be configured in a different shape from the second position checker 530 of FIG. 1.

The third position checker 580 may be configured to indicate a third position allowable range M3 in which the third side 800S of the third die 800 can be located. The third position checker 580 may be configured to have substantially the same shape as the first position checker 510. The third position checker 580 may include patterns indicating the third position allowable range M3 in which the third side 800S of the third die 800 can be located. The third position checker 580 may include a third reference pattern 581 and a third limit pattern 585. The third reference pattern 581 may indicate a third reference position at which the third side 800S of the third die 800 is to be located, and the third limit pattern 585 may be spaced apart from the third reference pattern 581 by the third position allowable range M3.

It is possible to check, evaluate, and inspect whether the width D1 of the portion 200B of the first die 200 and the width D23 of the portion 300B of the second die 300 are secured within the required allowable ranges using the first, second, and third position checkers 510, 530-1, and 580.

Figure 14:
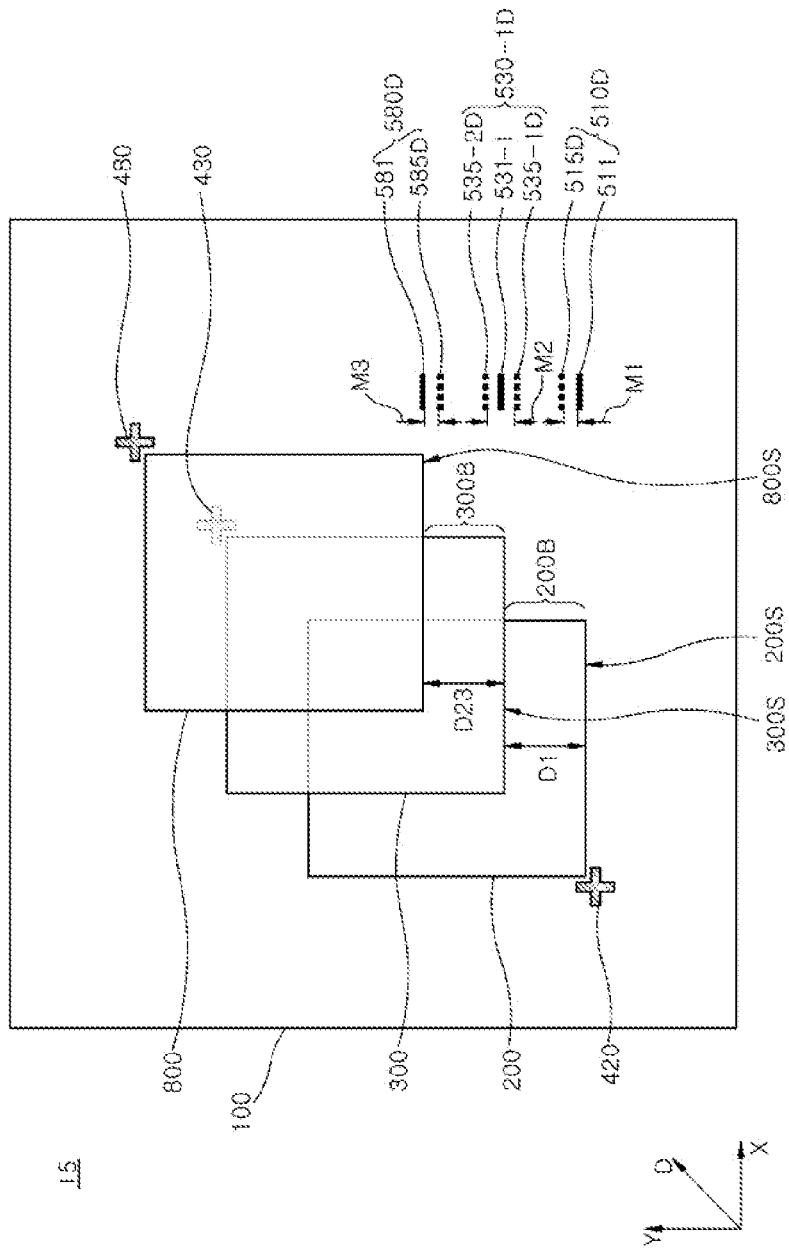
FIG. 14 is a schematic plan view illustrating a semiconductor package according to an embodiment.

FIG. 14 is a schematic plan view illustrating a semiconductor package 15 according to an embodiment. In FIG. 14, reference numerals indicated in the same manner as in FIG. 13 may be understood to mean the same members.

Referring to FIG. 14, the semiconductor package 15 may include a package substrate 100, a first die 200, a second die 300, and a third die 800. The semiconductor package 15 may further include a first fiducial mark 420, a second fiducial mark 430, and a third fiducial mark 480.

The semiconductor package 15 may further include a first position checker 510D, a second position checker 530-1D, and a third position checker 580D. The first position checker 510D may include a first reference pattern 511 and a first limit pattern 515D. The first reference pattern 511 may be formed as a pattern having a line shape, and the first limit pattern 515D may be formed as a pattern having a dotted line shape parallel to the line shape. Conversely, the first reference pattern 511 may be formed as a pattern having a dotted line shape, and the first limit pattern 515D may be formed as a pattern having a line shape parallel to the dotted line shape. Because the first reference pattern 511 and the first limit pattern 515D have different shapes, it may be easier to distinguish the first reference pattern 511 and the first limit pattern 515D visually or by images.

The second position checker 530-1D may include a second reference pattern 531-1, a second lower limit pattern 535-1D, and a second upper limit pattern 535-2D. The second reference pattern 531-1 may be formed as a pattern having a line shape, and the second lower limit pattern 535-1D and the second upper limit pattern 535-2D may be formed as patterns having dotted line shapes parallel to the line shape. The third position checker 580D may include a third reference pattern 581 and a third limit pattern 585D. The third reference pattern 581 may be formed as a pattern having a line shape, and the third limit pattern 585D may be formed as a pattern having a dotted line shape parallel to the line shape. In an embodiment, the first position checker 510D, the second position checker 530-1D, and the third position checker 580D may have the same, different, or a combination thereof of same and different limit and reference patterns.

Referring back to FIG. 1, the semiconductor package 10 according to an embodiment may include the first die 200 disposed on the package substrate 100. The second die 300 may be stacked on the first die 200 to be offset in the Y-axis direction. The first and second position checkers 510 and 530 may be disposed on the package substrate 100. The first and second position checkers 510 and 530 may be disposed on the package substrate 100 to be spaced apart from the structure in which the first and second dies 200 and 300 are stacked in the X-axis direction. The second position checker 530 may be disposed to be spaced apart from the first position checker 510 in the Y-axis direction.

The first position checker 510 may include the first reference pattern 511 and the first limit pattern 515. The first limit pattern 515 may be disposed to be spaced apart from the first reference pattern 511 by the first position allowable range M1 in the Y-axis direction. The first reference pattern 511 and the first limit pattern 515 may be patterns extending parallel in the X-axis direction.

According to the embodiments of the present disclosure as described above, it is possible to provide semiconductor packages in which semiconductor dies are stacked three-dimensionally. The semiconductor packages may include die position checkers. The die position checkers may be used as references for inspecting the stack positions of the semiconductor dies.

Figure 15:
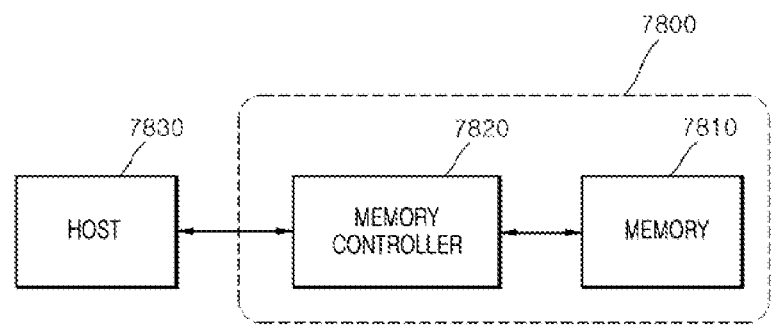
FIG. 15 is a block diagram illustrating an electronic system employing a memory card including a package according to an embodiment.

FIG. 15 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 16:
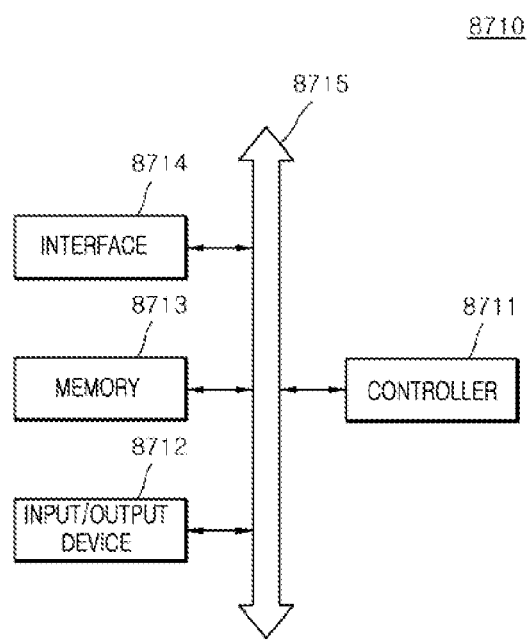
FIG. 16 is a block diagram illustrating an electronic system including a package according to an embodiment.

FIG. 16 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A semiconductor package comprising:
a first die disposed on a package substrate;
a second die stacked on the first die; and
first and second position checkers disposed on the package substrate to be spaced apart from the first and second dies,
wherein the first position checker indicates a first position allowable range in which a first side of the first die can be located, and
wherein the second position checker indicates a second position allowable range in which a second side of the second die can be located.

2. The semiconductor package of claim 1, wherein the first position checker comprises:
a first reference pattern indicating a first reference position where the first side of the first die is to be located; and
a first limit pattern spaced apart from the first reference pattern by the first position allowable range.

3. The semiconductor package of claim 2, wherein the second position checker comprises:
a second reference pattern indicating a second reference position where the second side of the second die is to be located; and
a second limit pattern spaced apart from the second reference pattern by the second position allowable range.

4. The semiconductor package of claim 3, wherein the first limit pattern and the second limit pattern are disposed to face each other between the first reference pattern and the second reference pattern.

5. The semiconductor package of claim 3, wherein the first limit pattern and the second limit pattern have line shapes extending substantially in parallel.

6. The semiconductor package of claim 5, wherein the first reference pattern and the second reference pattern have substantially the same shape, and the first limit pattern and the second limit pattern have substantially the same shape.

7. The semiconductor package of claim 3, wherein the first reference pattern has a line shape, and the first limit pattern has a dotted shape substantially parallel to the line shape.

8. The semiconductor package of claim 1, further comprising a first fiducial mark and a second fiducial mark disposed on the package substrate.

9. The semiconductor package of claim 1, wherein the second die is offset stacked from the first die such that a portion of the first die, adjacent to the first side of the first die is exposed outside the second side.

10. The semiconductor package of claim 9, wherein the first die further comprises bonding pads disposed in the portion, and
wherein the package substrate further comprises bonding fingers connected to the bonding pads by bonding wires.

11. The semiconductor package of claim 1, further comprising third and fourth position checkers disposed on the package substrate,
wherein the third position checker indicates a third position allowable range in which a third side crossing the first side of the first die can be located, and
wherein the fourth position checker indicates a fourth position allowable range in which a fourth side crossing the second side of the second die can be located.

12. The semiconductor package of claim 1, further comprising fifth and sixth position checkers disposed at positions opposite to the positions where the first and second position checkers are located, with the first and second dies therebetween.

13. A semiconductor package comprising:
a first die disposed on a package substrate;
a second die stacked on the first die to be offset in a Y-axis direction; and
first and second position checkers disposed on the package substrate,
wherein the first and second position checkers are disposed to be spaced apart from the first and second dies in an X-axis direction, and
wherein the second position checker is disposed to be spaced apart from the first position checker in the Y-axis direction.

14. The semiconductor package of claim 13, wherein the first position checker indicates a first position allowable range in which a first side of the first die can be located, and
wherein the second position checker indicates a second position allowable range in which a second side of the second die can be located.

15. The semiconductor package of claim 13, wherein the first position checker comprises:
a first reference pattern indicating a first reference position where the first side of the first die is to be located; and
a first limit pattern spaced apart from the first reference pattern by the first position allowable range in the Y-axis direction.

16. The semiconductor package of claim 15, wherein the first reference pattern and the first limit pattern are patterns extending substantially in parallel in the X-axis direction.

17. A semiconductor package comprising;
a first die disposed on a package substrate;
a second die stacked on the first die and offset stacked by a distance from the first die; and
a first position checker disposed on the package substrate to be and spaced apart from the first and second dies,
wherein the first position checker indicates a first position allowable range in which a first side of the first die can be located to have a normal separation distance from a second side of the second die.

* * * * *

UNITED STATES PATENT AND TRADEMARK OFFICE
CERTIFICATE OF CORRECTION

| | |
|---|---|
| PATENT NO. | : 11,764,160 B2 |
| APPLICATION NO. | : 17/148436 |
| DATED | : September 19, 2023 |
| INVENTOR(S) | : Bok Gyu Min and Suk Won Lee |

It is certified that error appears in the above-identified patent and that said Letters Patent is hereby corrected as shown below:

In the Specification

In Column 11, Lines 19-27 under "Detailed Description". Please replace paragraph with the following: The plurality of second bonding pads 213, the plurality of second bonding fingers 113, and the plurality of second bonding wires 613 may be arranged in columns along the Y-axis direction on the X-Y plane. The plurality of second bonding pads 213, the plurality of second bonding fingers 113, and the plurality of second bonding wires 613 may be arranged in columns, respectively, along the third side 200SC of the first die 200 and the fourth side 300SC of the second die 300.

Signed and Sealed this
Fourteenth Day of May, 2024

Katherine Kelly Vidal
*Director of the United States Patent and Trademark Office*